United States Patent
Yokotani et al.

(10) Patent No.: US 6,194,893 B1
(45) Date of Patent: Feb. 27, 2001

(54) MAGNETIC DETECTOR FOR DETECTING MOVEMENT OF A MAGNETIC MEMBER

(75) Inventors: Masahiro Yokotani; Yasuyoshi Hatazawa; Izuru Shinjo; Takuji Nada, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/162,887

(22) Filed: Sep. 30, 1998

(30) Foreign Application Priority Data

Apr. 21, 1998 (JP) .................................. 10-110916

(51) Int. Cl.$^7$ .............................. G01B 7/14; G01R 33/06
(52) U.S. Cl. ................... 324/207.21; 324/207.25; 324/207.12
(58) Field of Search .............................. 324/207.12, 207.2, 324/207.21, 252, 207.25, 202, 207.22, 207.24; 338/32 H, 32 R

(56) References Cited

U.S. PATENT DOCUMENTS

| | | | | |
|---|---|---|---|---|
| 4,853,632 | * | 8/1989 | Nagano et al. | 338/32 R |
| 5,021,736 | * | 6/1991 | Gonsalves et al. | 324/252 |
| 5,436,560 | * | 7/1995 | Murakami | 324/207.21 |
| 5,500,589 | * | 3/1996 | Sumcad | 324/207.21 |
| 5,600,238 | | 2/1997 | Holloway et al. | 324/207.21 |
| 5,644,226 | | 7/1997 | Aoyama et al. . | |

FOREIGN PATENT DOCUMENTS

| | | |
|---|---|---|
| 4005478 C2 | 11/1992 | (DE) . |
| 195 07 304 A1 | 9/1995 | (DE) . |
| 196 47 320 A1 | 12/1997 | (DE) . |
| 195 80 095 C2 | 2/1998 | (DE) . |
| WO 95/18982 | 7/1995 | (EP) . |
| 63-178925 | 11/1988 | (JP) . |

OTHER PUBLICATIONS

"Magnetoresistance of Multilayers" Journal of the Applied Magnetism Society of Japan, vol. 15, No. 5, 1991.

\* cited by examiner

*Primary Examiner*—Jay Patidar
(74) *Attorney, Agent, or Firm*—Sughrue, Mion, Zinn, Macpeak & Seas, PLLC

(57) ABSTRACT

A magnetic detector is disclosed with a power-on function which can essentially eliminate temperature characteristics of a magnetic field sensing device and improve edge detecting accuracy of alternately projected and recessed portions of a moving member of magnetic material. The magnetic detector comprises a magnet for generating a magnetic field, a rotary member of magnetic material disposed with a predetermined gap remaining relative to the magnet and having alternately projected and recessed portions to change the magnetic field generated by the magnet, a magnetoresistive device comprising a plurality of magnetic field sensing elements and detecting changes in the magnetic field by movement of the rotary member of magnetic material, and a magnetic guide for adjusting changes in the magnetic field caused by the alternately projected and recessed portions of the rotary member of magnetic material.

15 Claims, 9 Drawing Sheets

MAGNETIC DETECTOR FOR DETECTING MOVEMENT OF A MAGNETIC MEMBER

BACKGROUND OF THE INVENTION

1. Field of the Invention

The present invention relates to a magnetic detector for detecting changes in a magnetic field caused by movement of a moving member of magnetic material, and more particularly to a magnetic detector with a function of detecting alternately projected and recessed portions of a moving member of magnetic material in a power-on condition (referred to as a power-on function hereinafter).

2. Description of the Related Art

There is a known technique for detecting changes in a magnetic field wherein electrodes are formed at both ends of a magnetic field sensitive surface of magnetic field sensing devices (magnetoresistive devices are used in the description here) to construct a bridge; a constant-voltage and constant-current power supply is connected between the two opposing electrodes of the bridge to convert changes in the resistance value of the magnetic field sensing device into voltage changes, and changes in the magnetic field acting on the magnetic field sensing devices are detected on the basis of the voltage changes.

FIG. 9 is a circuit diagram showing an arrangement of a processing circuit in such a sensor using ordinary magnetic field sensing devices.

In FIG. 9, a Wheatstone bridge circuit 1 is made up of magnetic field sensing devices or resistances RA, RB, RC and RD given including at least one or more magnetic field sensing devices. Input terminals of a differential amplification circuit 2 are connected to a middle junction 4 between RA, RB and a middle junction 5 between RC, RD. A middle junction between RA, RD is connected to a power source terminal vcc, and a middle junction between RB, RC is connected to a ground GND. A differential amplification output 8 from the differential amplification circuit 2 is supplied to a comparison circuit 3 in a next stage.

In the above circuit, resistance values of the magnetic field sensing devices are changed upon changes in the magnetic field applied to resistances RA, RB, and a voltage at the middle junction 4 between RA, RB is changed corresponding to such changes in the applied magnetic field. The voltage across the middle junctions 4 and 5 is amplified by the differential amplification circuit 2, and a final output 9 having a level of "0" or "1" is obtained from the comparison circuit 3.

FIG. 10 is a schematic view showing a construction of a conventional magnetic detector.

In FIG. 10, the conventional magnetic detector comprises a rotary member of magnetic material 10 having a shape capable of changing a magnetic field, a magnetic field sensing device 11, magnetic field sensing elements 11a, 11b, a magnet 13, and a rotary shaft 12. When the rotary shaft 12 rotates, the rotary member of magnetic material 10 is also rotated in synchronous relation therewith.

The pitch center of the magnetic field sensing elements (resistances) 11a, 11b of the magnetic field sensing device 11 is arranged to be offset from the center of the magnet 13 by a predetermined amount.

In the above magnetic detector, upon rotation of the rotary member of magnetic material 10, the magnetic field applied to the resistances 11a, 11b of the magnetic field sensing device 11 is changed, and as shown in by way of example FIG. 11, the differential amplification output 8 is changed corresponding to the shape of the rotary member of magnetic material 10. As a result, a signal representing the final output 9 corresponding to the shape of the rotary member of magnetic material 10 can be obtained with the circuit shown in FIG. 9.

However, the magnetic circuit arrangement used in the conventional detector has had the following problems.

When the bridge is made up of magnetic field sensing devices and fixed resistances, a difference between their temperature coefficients. Also, when the bridge is made up of magnetic field sensing devices with a plurality of elements, a difference in the temperature coefficients occurs due to a difference in the magnetic field applied to the elements. Since there is such a difference in temperature coefficients, as shown in FIG. 12, the differential amplification output 8 (ROOM) at room temperature and the differential amplification output 8 (HOT) at high temperature exhibit temperature characteristics depending on changes in the applied magnetic field. This gives rise to a large deviation in the edge detecting accuracy of the alternately projected and recessed portions of the rotary member of magnetic material.

SUMMARY OF THE INVENTION

An object of the present invention is to provide a magnetic detector with a power-on function which can essentially eliminate the temperature characteristics of a magnetic field sensing device and improve the temperature characteristics of the edge detecting accuracy of alternately projected and recessed portions of a moving member of magnetic material.

A magnetic detector according to a first aspect of the present invention comprises a magnetic field generating means for generating a magnetic field, a moving member of magnetic material disposed with a predetermined gap remaining relative to the magnetic field generating means and having alternately projected and recessed portions to change the magnetic field generated by the magnetic field generating means, a magnetic field sensing device comprising a plurality of magnetic field sensing elements that detects changes in the magnetic field by movement of the moving member of magnetic material, and means for adjusting changes in the magnetic field caused by the alternately projected and recessed portions of the moving member of magnetic material.

In a magnetic detector according to a second aspect of the present invention, in addition to the features of the first aspect, the magnetic flux crosses the plurality of magnetic field sensing elements at a first predetermined angle when the recessed portion of the moving member of magnetic material is opposed to the magnetic field sensing device, the magnetic flux crosses the plurality of magnetic field sensing elements at a second predetermined angle when the projected portion of the moving member of magnetic material is opposed to the magnetic field sensing device, and the magnetic field generating means is adjusted so that the first and second predetermined angles are symmetrical with respect to the direction vertical to a plane in which the plurality of magnetic field sensing elements are arranged.

In a magnetic detector according to a third aspect of the present invention, in addition to the features of the first aspect, the magnetic flux crosses the plurality of magnetic field sensing elements at a first predetermined angle when the recessed portion of the moving member of magnetic material is opposed to the magnetic field sensing device, the magnetic flux crosses the plurality of magnetic field sensing elements at a second predetermined angle when the projected portion of the moving member of magnetic material is opposed to the magnetic field sensing device, and the magnetic field sensing device is adjusted so that the first and second predetermined angles are symmetrical with respect to the direction vertical to a plane in which the plurality of magnetic field sensing elements are arranged.

In a magnetic detector according to a fourth aspect of the present invention, in addition to the features of the first aspect, the magnetic flux crosses the plurality of magnetic field sensing elements at a first predetermined angle when the recessed portion of the moving member of magnetic material is opposed to the magnetic field sensing device, the magnetic flux crosses the plurality of magnetic field sensing elements at a second predetermined angle when the projected portion of the moving member of magnetic material is opposed to the magnetic field sensing device, and a magnetic guide is provided and adjusted so that the first and second predetermined angles are symmetrical with respect to the direction vertical to a plane in which the plurality of magnetic field sensing elements are arranged.

In a magnetic detector according to a fifth aspect of the present invention, in addition to the features of the fourth aspect, the magnetic guide is adjusted in the magnetized direction of the magnetic field generating means.

In a magnetic detector according to a sixth aspect of the present invention, in addition to the features of the fourth aspect, the magnetic guide is adjusted in a direction vertical to the magnetized direction of the magnetic field generating means.

In a magnetic detector according to a seventh aspect of the present invention, in addition to the features of the fourth aspect, the magnetic guide is adjusted in a direction oblique to the magnetized direction of the magnetic field generating means.

In a magnetic detector according to an eighth aspect of the present invention, in addition to the features of the fourth aspect, a magnetic bolt is used instead of the magnetic guide.

In a magnetic detector according to a ninth aspect of the present invention, in addition to the features of the first aspect, a GMR (gigantic magnetoresistive) device is used as the magnetic field sensing device.

In a magnetic detector according to a tenth aspect of the present invention, in addition to the features of the first aspect, the magnetic field generating means, disposed in opposing relation to the alternately projected and recessed portions of the moving member of magnetic material, is magnetized in the opposing direction, and the magnetic field sensing device is arranged to lie parallel to the opposing direction.

In a magnetic detector according to an eleventh aspect of the present invention, in addition to the features of the first aspect, the moving member of magnetic material is a rotary member of magnetic material rotating in synchronization with a rotary shaft.

DESCRIPTION OF THE PREFERRED EMBODIMENTS

Preferred embodiments of the present invention will be described below with reference to the drawings.

Embodiment 1

Figure 1:
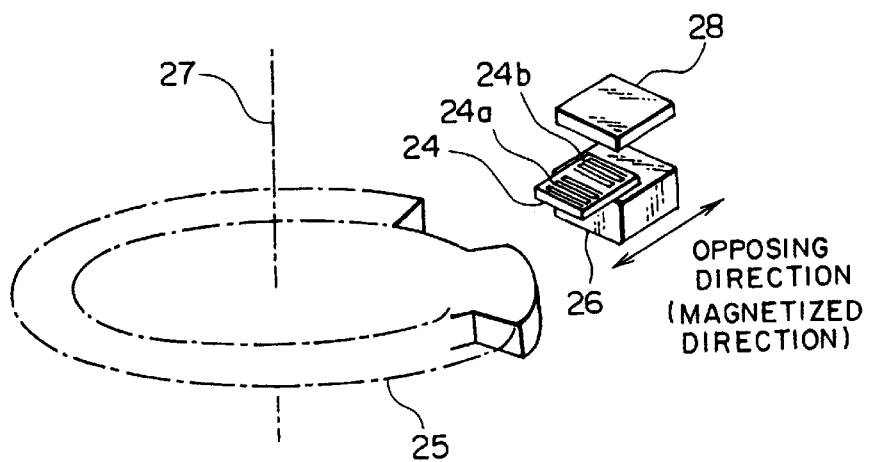
FIG. 1 is a schematic view showing a construction of a magnetic detector according to Embodiment 1 of the present invention.

FIG. 1 is a schematic view showing a construction of a magnetic detector according to Embodiment 1 of the present invention.

Figure 9:
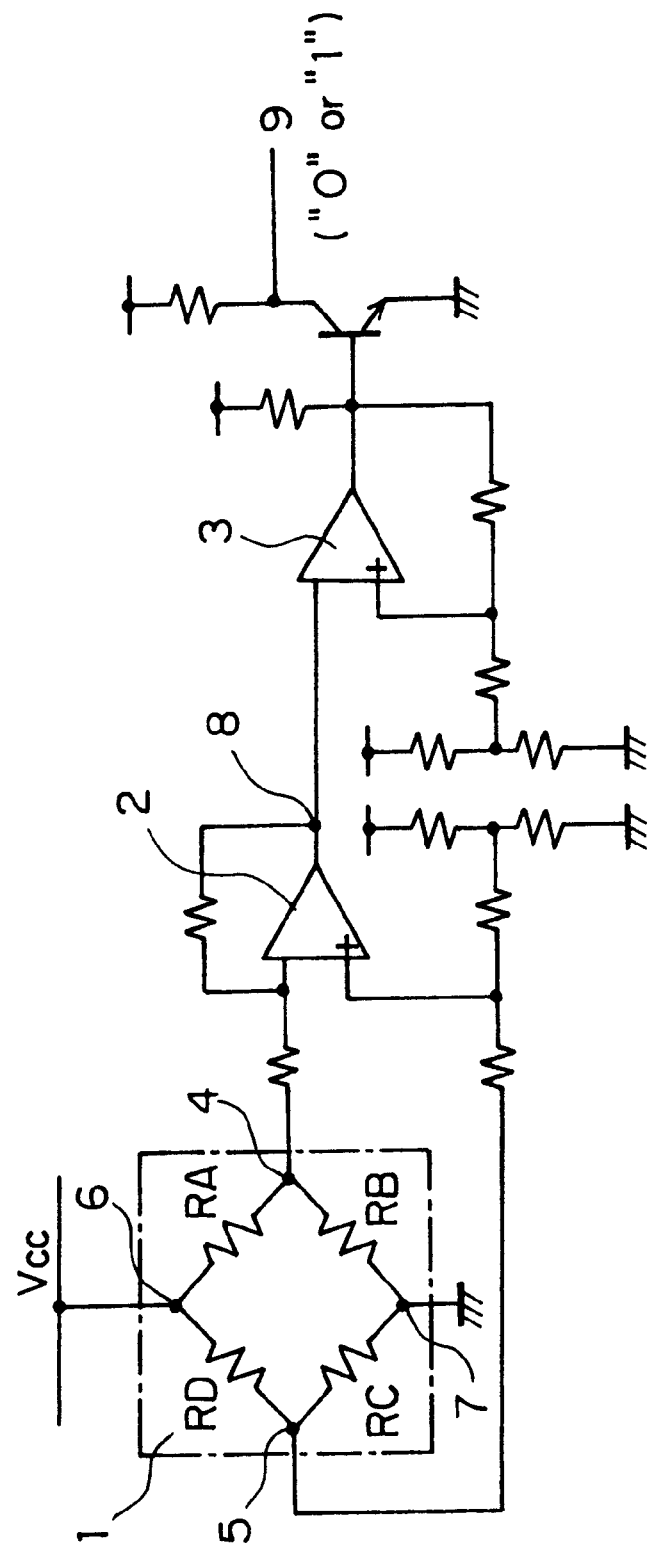
FIG. 9 is a circuit diagram showing an arrangement of a processing circuit in a sensor using ordinary magnetic field sensing devices.
Figure 10:
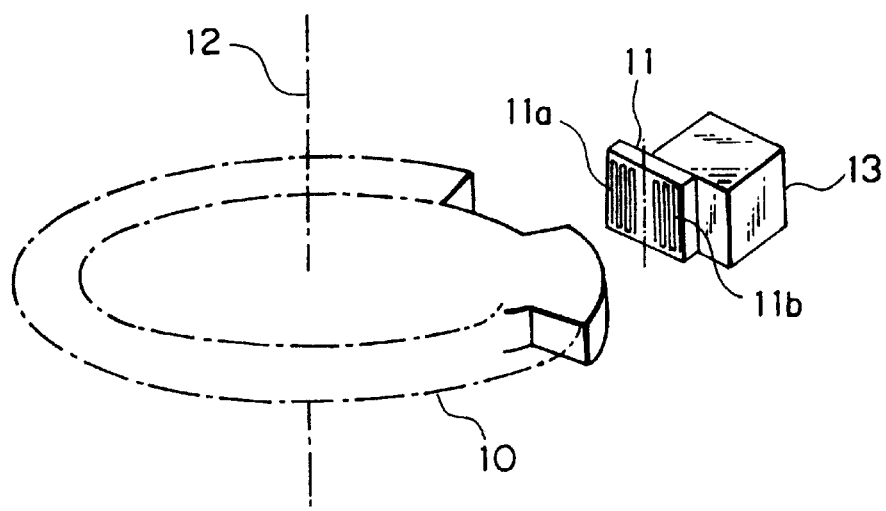
FIG. 10 is a schematic view showing a construction of a conventional magnetic detector.
Figure 11:
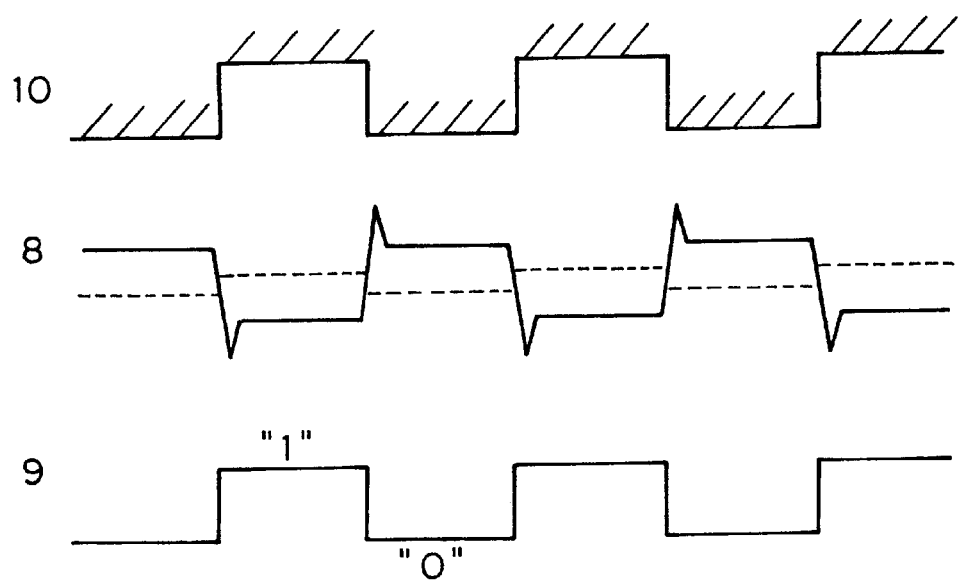
FIG. 11 is a timing chart showing output signals in the conventional magnetic detector.
Figure 12:
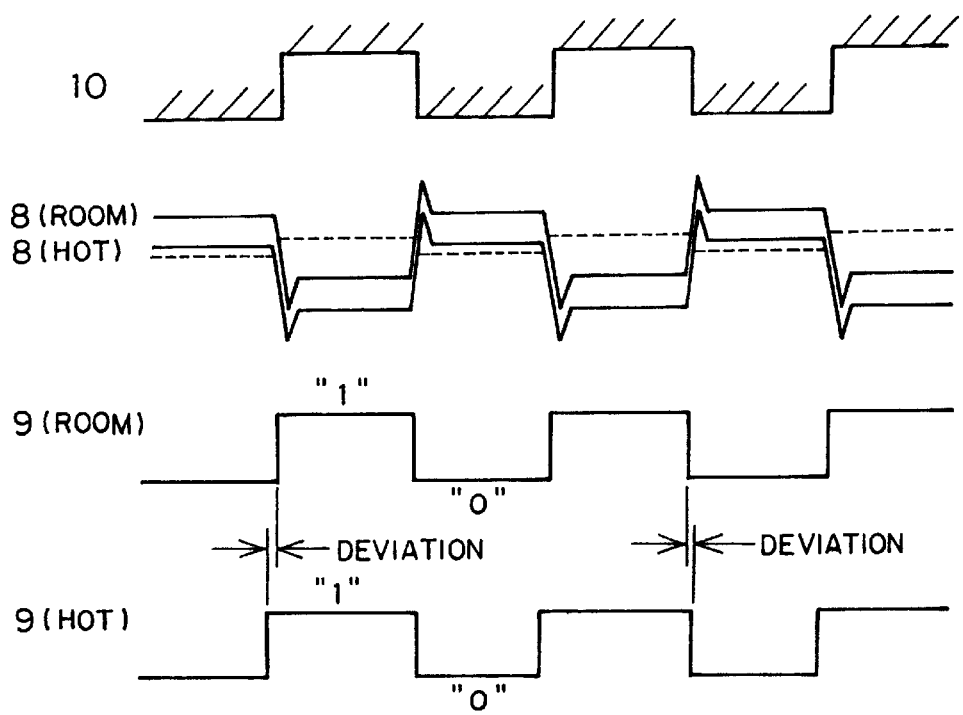
FIG. 12 is a timing chart showing output signals in the conventional magnetic detector.

The arrangement of a processing circuit in this embodiment may be the same as the conventional one shown in FIG. 9. The magnetic field sensing devices (resistances) RA, RB in FIG. 9 correspond to the magnetic field sensing devices used in this embodiment. In the following description of this embodiment, a magnetoresistive device is used as the magnetic field sensing device.

In FIG. 1, the magnetic detector comprises a magnetoresistive device 24, magnetic field sensing resistances 24a, 24b which essentially form the magnetoresistive device 24 and serve as magnetic field sensing elements constructing a bridge, a rotary member of magnetic material 25 as a moving member of magnetic material, a magnet 26 as magnetic field generating means, a rotary shaft 27, and a magnetic guide 28 as a means for adjusting a change in the magnetic field caused by alternately projected and recessed portions of the rotary member of magnetic material 25.

The magnet 26 is arranged in opposing relation to the rotary member of magnetic material 25 and is magnetized in the opposing direction. The magnetoresistive device 24 is disposed to lie in the magnetized direction of the magnet 26 such that one pair (or two pairs) of magnetic field sensing elements are arranged parallel to each other in the magnetized direction of the magnet 26 and aligned with a line extending in the magnetized direction thereof. The rotary member of magnetic material 25 has a shape capable of changing the magnetic field applied to the magnetoresistive device 24, and is rotated in synchronization with rotation of the rotary shaft 27.

Figure 2:
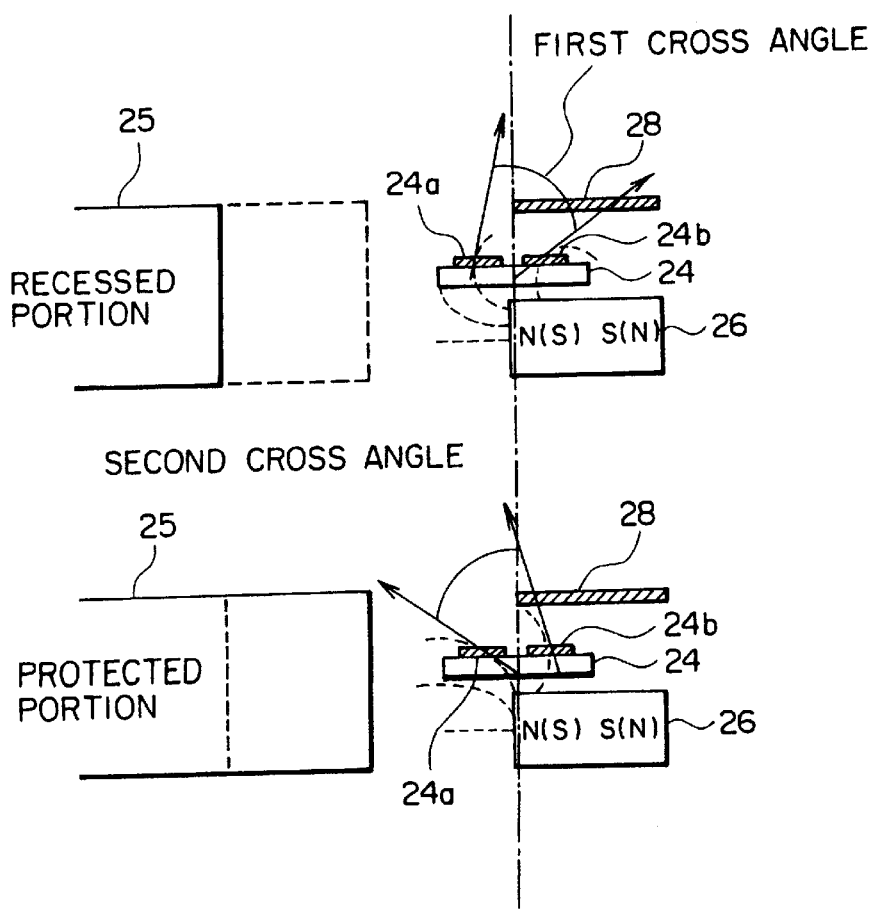
FIG. 2 is an explanatory view showing change of a magnetic field vector in Embodiment 1 of the present invention.

FIG. 2 shows the vector direction of a magnetic field applied to the magnetoresistive device in the magnetic circuit of this embodiment.

The magnetic flux crosses the magnetic field sensing resistances 24a, 24b at a first predetermined angle when the recessed portion of the rotary member of magnetic material is opposed to the magnetoresistive device 24. The magnetic flux crosses the magnetic field sensing resistances 24a, 24b at a second predetermined angle when the projected portion of the rotary member of magnetic material 25 is opposed to the magnetoresistive device 24. The position of the magnetic guide 28 is adjusted so that the first and second predetermined angles are symmetrical with respect to the direction vertical to a plane in which the magnetic field sensing resistances are arranged.

Figure 3:
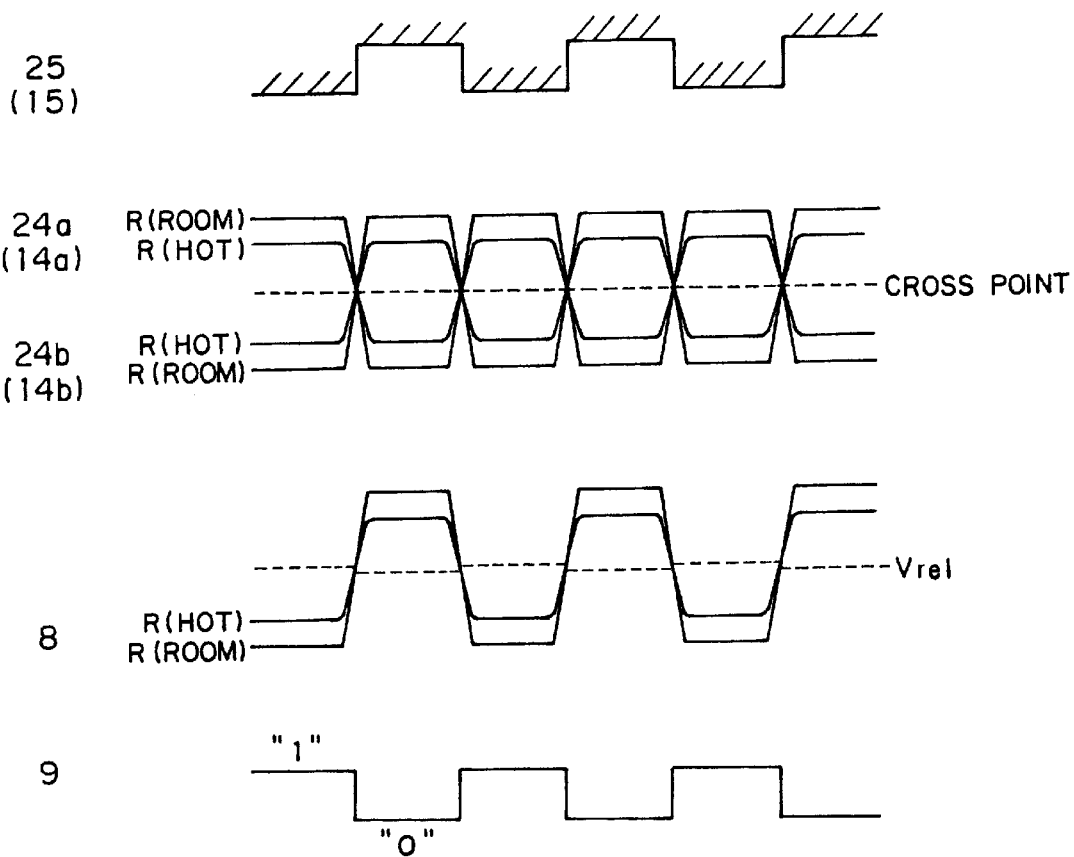
FIG. 3 is a timing chart showing output signals in Embodiment 1 of the present invention.

The operation of the magnetic detector will now be described with reference to FIG. 3.

Changes in the resistance values of the magnetic field sensing resistances 24a, 24b, caused by changes in the magnetic field corresponding to the alternately projected and recessed portions of the rotary member of magnetic material 25, at room temperature are represented by R(ROOM) and at high temperature by R(HOT).

The magnetic field applied to the magnetic field sensing resistances 24a, 24b is symmetrically changed depending on the alternately projected and recessed portions of the rotary member of magnetic material 25, as described above with reference to FIG. 2, and the resistance values of the magnetic field sensing resistances 24a, 24b are also symmetrically changed. This means that the resistance values of the magnetic field sensing resistances 24a, 24b agree with each other at any point in both room temperature and high temperature conditions. Consequently, the bridge comprised of the magnetic field sensing resistances 24a, 24b, the differential amplification output 8 (ROOM) at room temperature and the differential amplification output 8 (HOT) at high temperature cross each other. The temperature characteristics of edge detecting accuracy of the alternately projected and recessed portions of the rotary member of magnetic material 25 can be improved by setting a comparison level Vref of the comparison circuit 3 to the cross point of the temperature characteristic lines representing the differential amplification outputs 8, and a signal that precisely corresponds to the alternately projected and recessed portions of the rotary member of magnetic material 25 and that is capable of providing the power-on function can be obtained.

Figure 4:
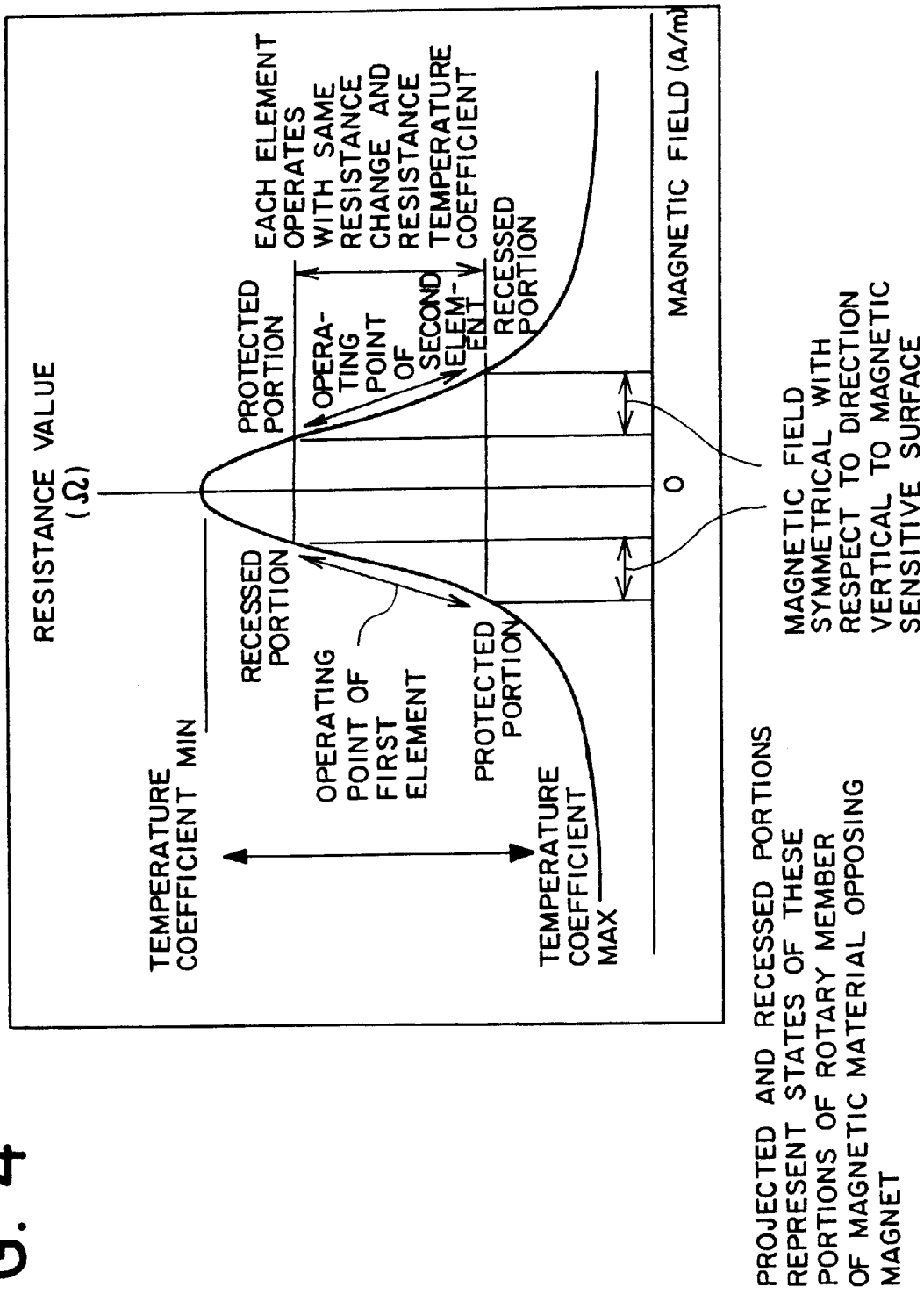
FIG. 4 is a graph for explaining the operation of Embodiment 1 of the present invention.

FIG. 4 shows the relationship between resistance changes and the resistance temperature coefficient with respect to the magnetic field applied to the magnetoresistive device. As can be seen from FIG. 4, the magnetoresistive device has different resistance temperature coefficients depending on its resistance value which varies with the applied magnetic field. Consequently, a pair of magnetic field sensing elements are operated while being subject to changes in magnetic field so as to exhibit resistance values and temperature coefficients which are coincident with each other in a symmetrical relationship, thereby canceling temperature characteristics of the magnetic field sensing elements, i.e., eliminating temperature characteristics of the magnetoresistive device.

In this embodiment, as described above, since the resistance values and temperature coefficients of the pair of magnetic field sensing elements constituting the magnetic field sensing device are changed in a symmetrical relationship by changes in magnetic field corresponding to the alternately projected and recessed portions of the rotary member of magnetic material, by constructing a bridge with one pair of magnetic field sensing elements or a Wheatstone bridge with two pairs of magnetic field sensing elements, it is possible to eliminate temperature characteristics of the magnetic field sensing device, to improve the edge detecting accuracy of the alternately projected and recessed portions of the rotary member of magnetic material, and to ensure the power-on function.

Further, since the magnet and the magnetic field sensing device are both arranged parallel to each other in the direction opposed to the alternately projected and recessed portions of the rotary member of magnetic material, leads used for wiring or bending work necessary for insertion, etc. are omitted and productivity can be improved.

Embodiment 2

Figure 5:
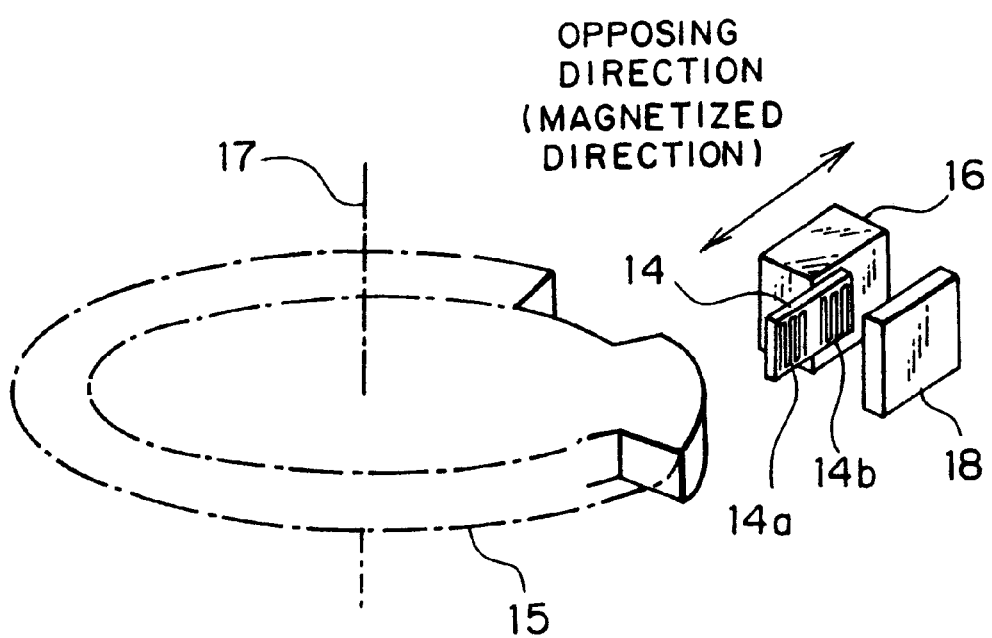
FIG. 5 is a schematic view showing a construction of a magnetic detector according to Embodiment 2 of the present invention.

FIG. 5 is a schematic view showing construction of a magnetic detector according to Embodiment 2 of the present invention.

Embodiment 2 is basically the same as Embodiment 1 above except that the magnet 26 including the magnetoresistive device 24, shown in FIG. 1, is rotated 90° with respect to the rotary member of magnetic material 25. In FIG. 5, a magnetoresistive device 14, magnetic field sensing resistances 14a, 14b which essentially form the magnetoresistive device 14 and serve as magnetic field sensing elements constructing a bridge, a rotary member of magnetic material 15 as a moving member of magnetic material, a magnet 16 as magnetic field generating means, a rotary shaft 17, and a magnetic guide 18 as means for adjusting changes in magnetic field caused by alternately projected and recessed portions of the rotary member of magnetic material 25 correspond respectively to the magnetoresistive device 24, the magnetic field sensing resistances 24a, 24b, the rotary member of magnetic material 25, the magnet 26, the rotary shaft 27 and the magnetic guide 28.

Accordingly, the operating principles and advantages of this embodiment are the same as in Embodiment 1; hence the description thereof is not repeated here.

Embodiment 3

Figure 6:
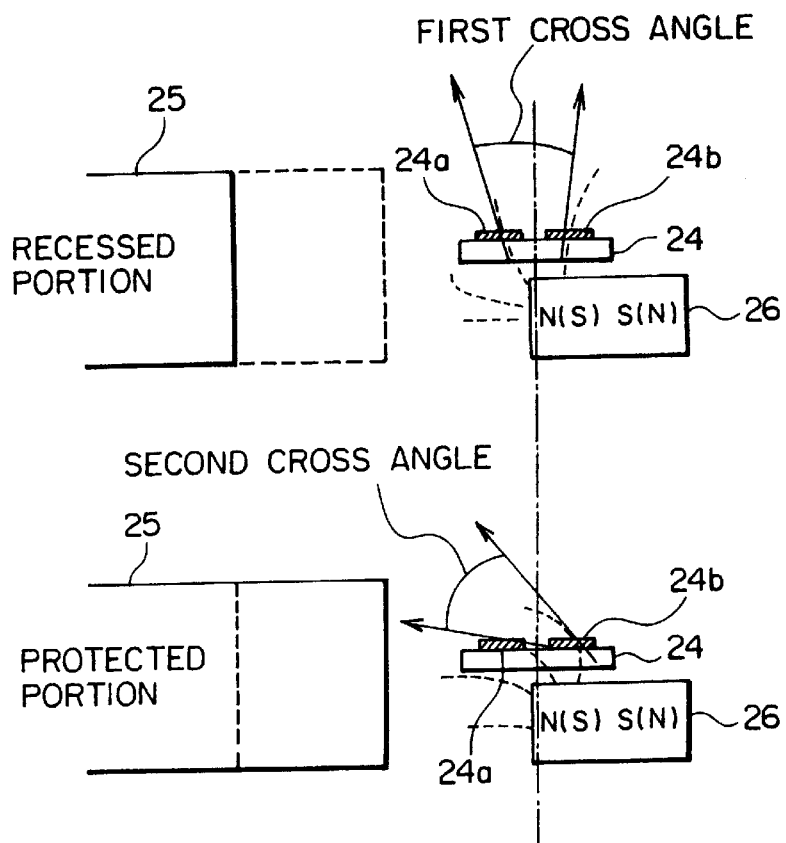
FIG. 6 is an explanatory view showing a change of a magnetic field vector in Embodiment 3 of the present invention.
Figure 7:
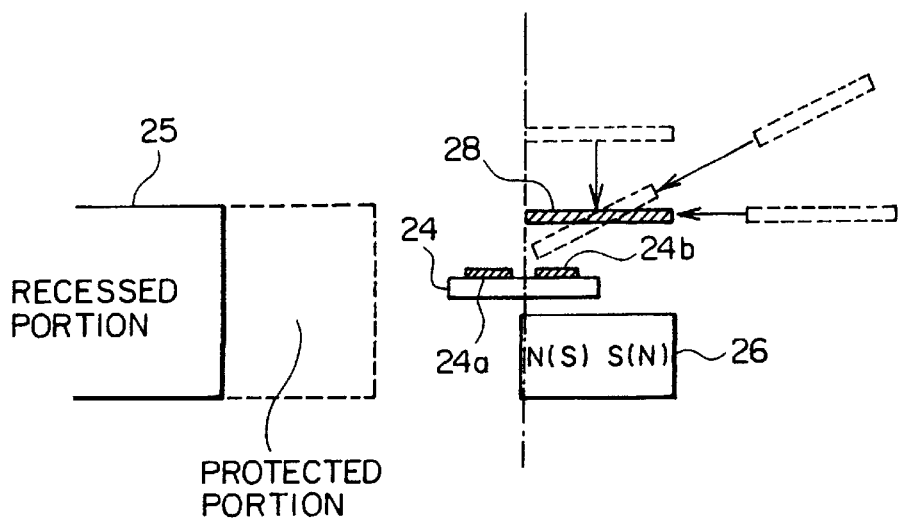
FIG. 7 is an explanatory view showing a change of a magnetic field vector in Embodiment 3 of the present invention.

FIGS. 6 and 7 are schematic views for explaining a method of adjusting the magnetic field applied to the magnetic field sensing device with the magnetic guide 28 mentioned in Embodiment 1 above.

In FIGS. 6 and 7, components corresponding to those in FIGS. 1 and 2 are denoted by the same reference numerals and the detailed description thereof is omitted here.

If no means for adjusting the applied magnetic field is provided in Embodiments 1 and 2, the first and second cross angles, at which the applied magnetic field crosses the magnetic field sensing elements 24a, 24b of the magnetoresistive device 24 when the alternately projected and recessed portions of the rotary member of magnetic material 25 are opposed to the magnet 26, may not be symmetrical with respect to the direction vertical to the plane in which the magnetic field sensing elements 24a, 24b are arranged, as shown in FIG. 6, due to the variations in relative positional relationship between the magnet 26 and the magnetoresistive device 24. The magnetic guide 28 is provided to adjust the first and second cross angles so that they become symmetrical.

In FIG. 6, the first and second cross angles shown in FIG. 2 representing Embodiment 1 can be obtained as the magnetic guide 28 (see FIG. 7) is moved to gradually approach the magnetoresistive device 24 and the magnet 26 with the magnetoresistive device 24 therebetween.

The magnetic guide 28 may be moved for adjustment in various directions; parallel, vertical or oblique to the magnetized direction of the magnet 26, as indicated by broken lines in FIG. 7. When the magnetic guide 28 is moved in the vertical direction, the first and second cross angles are sharply changed. Therefore, the vertical movement is effective when a deviation in the relative positional relationship between the magnet 26 and the magnetoresistive device 24 is large. When the magnetic guide 28 is moved in the parallel direction, the first and second cross angles are changed more slowly than when it is moved in the vertical direction, and therefore the parallel movement is effective when a fine adjustment in accuracy is required.

Embodiment 4

Figure 8A:
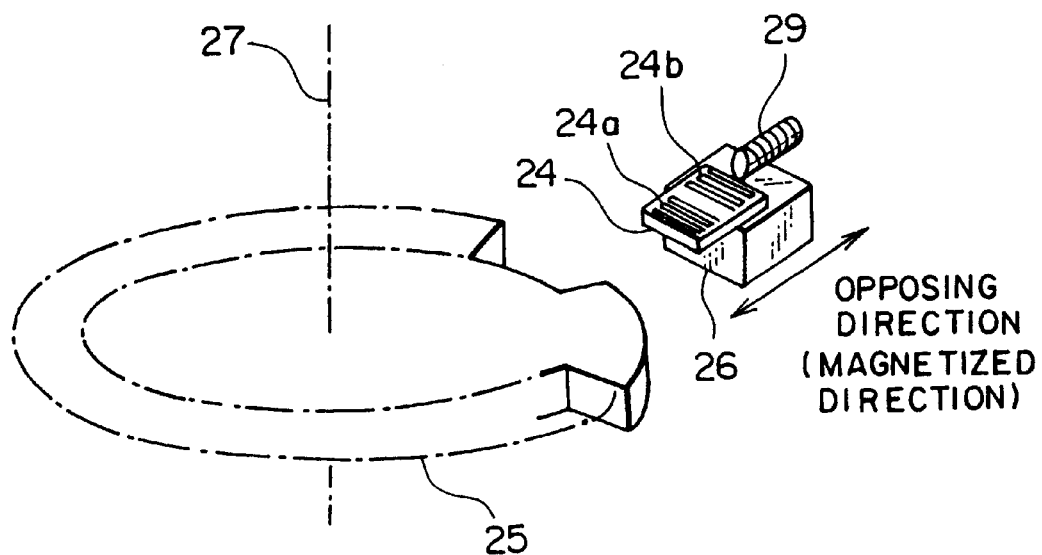
FIG. 8 is a schematic view showing a construction of a magnetic detector according to Embodiment 4 of the present invention.
Figure 8B:
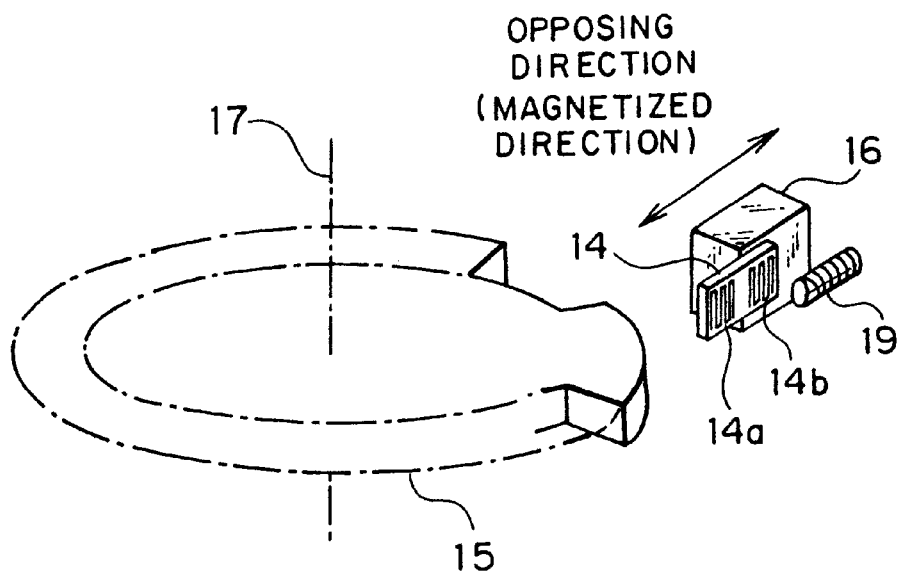

FIG. 8 is a schematic view showing a construction of a magnetic detector according to Embodiment 4 of the present invention.

In Embodiment 4, magnetic bolts 29, 19 are used instead of magnetic guides 28, 18 in above Embodiments 1, 2 and 3, respectively, as a means for adjusting changes in the magnetic field caused by the alternately projected and recessed portions of the rotary member of magnetic material 25. Other equivalent components are denoted by the same reference numerals and the detailed description thereof is omitted here.

Although the processing circuit arrangement and the operating principles of this embodiment are the same as in Embodiment 1, adjustment sensitivity per unit length is smaller in this embodiment than the above embodiments using the magnetic guides because the magnetic body is in the form of a bolt and the adjustment can be made by turning the bolt. Accordingly, the cross angle between the magnetic field and the magnetoresistive device can be more finely adjusted and adjustment accuracy can be improved. In other words, this embodiment is essentially one example of adjusting the magnetic guide in the parallel direction. Since the magnetic bolt is rotated over a larger distance than when linearly moving the magnetic plate in the parallel direction, finer adjustment can be realized.

Embodiment 5

In Embodiment 5, a so-called gigantic magnetoresistive device (referred to as a GMR device hereinafter) is used as the magnetoresistive device.

A GMR device is a so-called artificial lattice film, i.e., a laminate manufactured by alternately forming a magnetic layer and a non-magnetic layer with thicknesses of several angstroms to several tens of angstroms one on top of the other as described in "Magnetoresistance Effect of Artificial Lattice", Journal of the Applied Magnetism Society of Japan, Vol. 15, No. 51991, pp. 813–821. Such known artificial lattice films are represented by $(Fe/Cr)_n$, $(Permalloy/Cu/Co/Cu)_n$, and $(Co/Cu)_n$ (where n is the number of layered films). The GMR device exhibits a much greater MR effect (MR change rate) than an ordinary magnetoresistive device (referred to as MR device hereinafter), and the MR effect is developed depending only on relative angle between the magnetized directions of adjacent magnetic layers. Thus, the GMR device is an in-plane magnetic sensitive device which produces the same resistance changes regardless of any angular difference in the direction of an external magnetic field with respect to a current.

The detector construction and the processing circuit arrangement in this embodiment are essentially the same as in Embodiment 1, and hence the description thereof is omitted here.

With this embodiment, since a GMR device is used, an SN ratio is improved and a signal corresponding to the alternately projected and recessed portions of the rotary member of magnetic material can be obtained with higher accuracy.

It is needless to say that when the present invention is applied to a linear displacement detector wherein the rotary member of magnetic material used in each of the above embodiments is replaced with a magnetic body which has alternately projected and recessed portions and is displaced linearly, similar advantages can also be obtained with a similar processing circuit arrangement and magnetic circuit arrangement.

What is claimed is:

1. A magnetic detector comprising:
    a magnetic field generator for generating a magnetic field;
    a moving member of magnetic material disposed at a predetermined distance from said magnetic field generator said moving member of magnetic material having alternately projecting and recessed portions to change the magnetic field generated by said magnetic field generator;
    a magnetic field sensor comprising a plurality of magnetic field sensing elements arranged parallel to each other on a surface of said magnetic field generator in a direction pependicular to the projecting and recessed portions of said moving member of magnetic material, for detecting variations in the magnetic field resulting from movement of said moving member of magnetic material, and
    a magnetic guide, located a predetermined distance from said magnetic field generator and said magnetic field sensor, for adjusting cross angles of a magnetic field pattern created by the alternately projecting and recessed portions of said moving member of magnetic material.

2. A magnetic detector according to claim 1, wherein a GMR (gigantic magnetoresistive) device is used as said magnetic field sensing device.

3. A magnetic detector according to claim 1, wherein said magnetic field generator is disposed in opposing relation to the alternately projecting and recessed portions of said moving member of magnetic material and is magnetized in said opposing direction, and said magnetic field sensor is arranged to lie parallel to said opposing direction.

4. A magnetic detector according to claim 1, wherein said moving member of magnetic material is a rotary member of magnetic material rotating in synchronization with a rotary shaft.

5. A magnetic detector comprising:
    a magnetic field generator for generating a magnetic field;
    a moving member of magnetic material disposed at a predetermined distance from said magnetic field generator, said moving member of magnetic material having alternately projecting and recessed portions to change the magnetic field generated by said magnetic field generator;
    a magnetic field sensor comprising a plurality of magnetic field sensing elements for detecting variations in the magnetic field resulting from movement of said moving member of magnetic material, and
    a magnetic guide, located a predetermined distance from said magnetic field generator and said magnetic field sensor, for adjusting the magnetic field pattern created by the alternately projecting and recessed portions of said moving member of magnetic material, wherein a magnetic flux crosses said plurality of magnetic field sensing elements at a first predetermined angle when the recessed portion of said moving member of magnetic material is opposed to said magnetic field sensor, the magnetic flux crosses said plurality of magnetic field sensing elements at a second predetermined angle when the projected portion of said moving member of magnetic material is opposed to said magnetic field sensor, and said magnetic field generator is adjusted so that said first and second predetermined angles are symmetrical with respect to a direction vertical to a plane in which said plurality of magnetic field sensing elements are arranged.

6. A magnetic detector comprising:

a magnetic field generator for generating a magnetic field;

a moving member of magnetic material disposed at a predetermined distance from said magnetic field generator, said moving member of magnetic material having alternately projecting and recessed portions to chance the magnetic field generated by said magnetic field generator;

a magnetic field sensor comprising a plurality of magnetic field sensing elements for detecting variations in the magnetic field resulting from movement of said moving member of magnetic material, and a magnetic guide, located a predetermined distance from said magnetic field generator and said magnetic field sensor, for adjusting the magnetic field pattern created by the alternately projecting and recessed portions of said moving member of magnetic material, wherein a magnetic flux crosses said plurality of magnetic field sensing elements at a first predetermined angle when the recessed portion of said moving member of magnetic material is opposed to said magnetic field sensor, the magnetic flux crosses said plurality of magnetic field sensing elements at a second predetermined angle when the projected portion of said moving member of magnetic material is opposed to said magnetic field sensor, and said magnetic field sensor is adjusted so that said first and second predetermined angles are symmetrical with respect to a direction vertical to a plane in which said plurality of magnetic field sensing elements are arranged.

7. A magnetic detector comprising:

a magnetic field generator for generating a magnetic field;

a moving member of magnetic material disposed at a predetermined distance from said magnetic field generator, said moving member of magnetic material having alternately projecting and recessed portions to change the magnetic field generated by said magnetic field generator;

a magnetic field sensor comprising a plurality of magnetic field sensing elements for detecting variations in the magnetic field resulting from movement of said moving member of magnetic material, and a magnetic guide, located a predetermined distance from said magnetic field generator and said magnetic field sensor, for adjusting the magnetic field pattern created by the alternately projecting and recessed portions of said moving member of magnetic material, wherein a magnetic flux crosses said plurality of magnetic field sensing elements at a first predetermined angle when the recessed portion of said moving member of magnetic material is opposed to said magnetic field sensor, the magnetic flux crosses said plurality of magnetic field sensing elements at a second predetermined angle when the projected portion of said moving member of magnetic material is opposed to said magnetic field sensor, and a magnetic guide is provided and adjusted so that said first and second predetermined angles are symmetrical with respect to a direction vertical to a plane in which said plurality of magnetic field sensing elements are arranged.

8. A magnetic detector according to claim 7, wherein said magnetic guide is adjusted in a direction parallel to the magnetized direction of said magnetic field generator.

9. A magnetic detector according to claim 7, wherein said magnetic guide is adjusted in a direction vertical to the magnetized direction of said magnetic field generator.

10. A magnetic detector according to claim 7, wherein said magnetic guide is adjusted in a direction oblique to the magnetized direction of said magnetic field generator.

11. A magnetic detector according to claim 7, having a magnetic bolt which adjusts the magnetic field.

12. A magnetic detector comprising:

a magnetic field generating means for generating a magnetic field;

a moving member of magnetic material disposed at a predetermined distance from said magnetic field generating means, said moving member of magnetic material having alternately projecting and recessed portions to change the magnetic field generated by said magnetic field generating means;

a magnetic field sensing means comprising a plurality of magnetic field sensing elements arranged parallel to each other on a surface of said magnetic field generator and in a direction perpendicular to the projecting and recessed portions of said moving member of magnetic material, for detecting variations in the magnetic field resulting from movement of said moving member of magnetic material, and a magnetic guide means, located a predetermined distance from said magnetic field generator and said magnetic field sensor, for adjusting cross angles of a magnetic field pattern created by the alternately projecting and recessed portions of said moving member of magnetic material.

13. A magnetic detector according to claim 12, wherein a GMR (gigantic magnetoresistive) device is used as said magnetic field sensing means.

14. A magnetic detector according to claim 12, wherein said magnetic field generating means is disposed in opposing relation to the alternately projecting and recessed portions of said moving member of magnetic material and is magnetized in said opposing direction, and said magnetic field sensor is arranged to lie parallel to said opposing direction.

15. A magnetic detector according to claim 12, wherein said moving member of magnetic material is a rotary member of magnetic material rotating in synchronization with a rotary shaft.

* * * * *